United States Patent
Hales et al.

(10) Patent No.: US 10,587,283 B1
(45) Date of Patent: Mar. 10, 2020

(54) MISMATCH COMPENSATION IN AN ANALOG-TO-DIGITAL CONVERTER USING REFERENCE PATH RECONFIGURATION

(71) Applicant: NXP USA, Inc., Austin, TX (US)

(72) Inventors: Rex Kenton Hales, Mesa, AZ (US); Bruce Michael Newman, Gilbert, AZ (US)

(73) Assignee: NXP USA, INC., Austin, TX (US)

( * ) Notice: Subject to any disclaimer, the term of this patent is extended or adjusted under 35 U.S.C. 154(b) by 0 days.

(21) Appl. No.: 16/236,690

(22) Filed: Dec. 31, 2018

(51) Int. Cl.
H03M 1/12 (2006.01)
H03M 3/00 (2006.01)
H03M 1/06 (2006.01)

(52) U.S. Cl.
CPC ......... H03M 3/328 (2013.01); H03M 1/0634 (2013.01); *H03M 3/464* (2013.01)

(58) Field of Classification Search
CPC ...... H03M 3/456; H03M 1/12; H03M 1/0641; H03M 1/468; H03M 3/43; H03M 7/10; H03M 3/39; H03M 1/0668; H03M 1/201; H03M 1/462; H03M 3/424; H03M 1/365
USPC .................. 341/118–120, 143, 155–159, 163
See application file for complete search history.

(56) References Cited

U.S. PATENT DOCUMENTS

| | | | |
|---|---|---|---|
| 5,194,866 A * | 3/1993 | Imaizumi | H03M 1/144 341/156 |
| 5,745,061 A | 4/1998 | Norsworthy et al. | |
| 6,710,729 B1 | 3/2004 | Chen | |
| 6,768,437 B1 | 7/2004 | Ruotsalainen et al. | |
| 7,436,338 B2 | 10/2008 | Hales et al. | |
| 7,535,391 B1 * | 5/2009 | Newman | H03M 1/0673 341/131 |
| 2006/0017595 A1 * | 1/2006 | Van Veldhoven | H03M 3/348 341/143 |
| 2008/0204293 A1 * | 8/2008 | Lin | G09G 3/2014 341/144 |
| 2008/0309541 A1 * | 12/2008 | Pelgrom | H03M 1/0673 341/159 |
| 2010/0207797 A1 * | 8/2010 | Bien | H03M 1/0604 341/155 |
| 2012/0206281 A1 * | 8/2012 | Bashirullah | H03M 1/1061 341/110 |
| 2015/0084799 A1 * | 3/2015 | Zare-Hoseini | H03M 1/12 341/155 |
| 2016/0204794 A1 * | 7/2016 | Quiquempoix | H03M 1/0641 341/131 |
| 2017/0294922 A1 * | 10/2017 | Illing | H03M 1/38 |

* cited by examiner

*Primary Examiner* — Linh V Nguen

(57) ABSTRACT

An analog-to-digital converter (ADC) and a method are disclosed. The ADC has a quantizer. The quantizer comprises a linear-feedback shift register (LFSR), a decoder configured to provide a plurality of switch control signals at a plurality of decoder outputs, respectively, the plurality of switch control signals responsive to a LFSR value of the LFSR output; an electrical reference, the electrical reference having a plurality of reference outputs, the electrical reference configured to provide a plurality of reference levels at the plurality of reference outputs, respectively; a first switch providing a first switch output and a second switch output; and a comparator, the comparator having a signal input, a first reference input, and a second reference input, the first reference input connected to the first switch output, and the second reference input connected to the second switch output.

20 Claims, 3 Drawing Sheets

US 10,587,283 B1

MISMATCH COMPENSATION IN AN ANALOG-TO-DIGITAL CONVERTER USING REFERENCE PATH RECONFIGURATION

FIELD OF THE DISCLOSURE

The present disclosure relates generally to data conversion between an analog form and a digital form and more specifically to mismatch compensation for a data conversion circuit.

BACKGROUND OF THE DISCLOSURE

If it were possible to perfectly fabricate a data conversion circuit, such as an analog-to-digital converter (ADC) or digital-to-analog converter (DAC), from ideal elements, the data conversion circuit could perform in a fully and precisely accurate manner. However, non-ideal circumstances can impair performance of a practicable data conversion circuit.

For example, in a radar system, harmonic distortion in an ADC can cause intermodulation distortion (IMD) products, which can appear as false targets returned by the radar system. When, for example, such a radar system is used to control braking of a vehicle, the false targets can activate an automatic braking feature, stopping the vehicle for no apparent reason.

Harmonic distortion in a continuous-time sigma-delta modulator, as may be found in a sigma-delta ADC, is caused primarily by element mismatch in the DAC current sources. This is a well-known problem and is usually addressed using dynamic element matching techniques. However, such dynamic element matching techniques can have undesirable consequences, such as increasing semiconductor die area occupied by the circuit, increasing power consumption, increasing noise generation, causing excess loop delay giving rise to stability concerns. Thus, a technique that avoids such disadvantages would be a technological improvement over existing technology.

BRIEF DESCRIPTION OF THE DRAWINGS

The present disclosure may be better understood, and its numerous features and advantages made apparent to those skilled in the art by referencing the accompanying drawings.

The use of the same reference symbols in different drawings indicates similar or identical items.

DETAILED DESCRIPTION OF THE DRAWINGS

Figure 1:
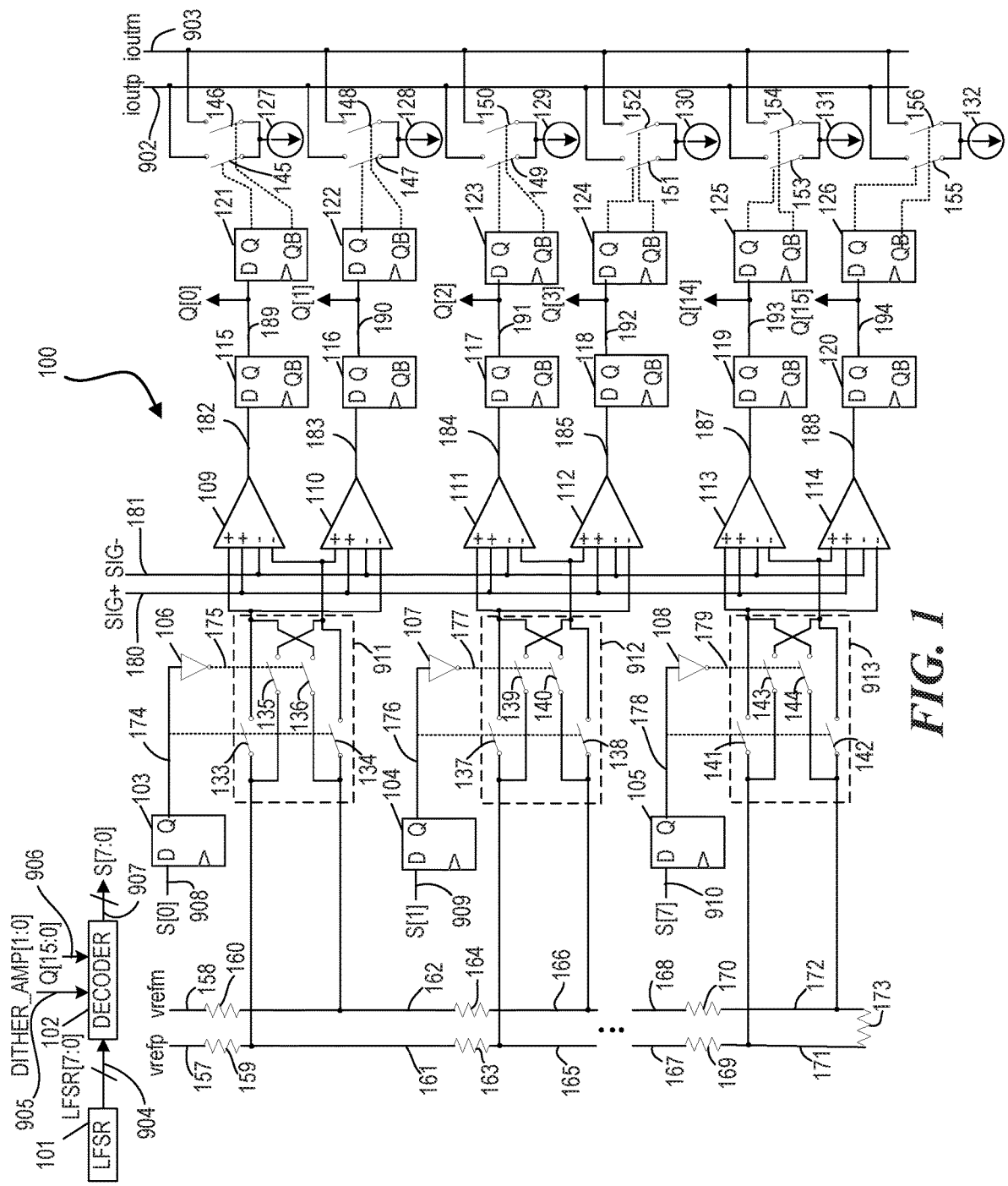
FIG. 1 is a block diagram illustrating a circuit in accordance with at least one embodiment.

A method and apparatus use reference path reconfiguration to provide mismatch compensation in an analog-to-digital converter (ADC). Swapping of reference lines for pairs of comparators is performed to provide mismatch compensation.

The ADC converts an analog signal to a digital signal. While the analog signal may vary over a range of levels without being constrained to values among a finite range of discrete levels, the analog signal is quantified, for a sample time period, to be at a particular discrete level among a finite range of discrete levels. Since the particular discrete level is not precisely identical to and varies in at least an infinitesimal amount from the actual level of the analog signal being sampled during that sampling time period, quantization introduces error. If the error were uncorrelated with the signal, the effect of the error could be limited to the particular sample in which it occurs. However, if the error is correlated to the signal, the incidence of the error can be deterministic and cyclical. Cyclical effects of correlated error can include what are called tones, in a manner similar to that in which a cyclical variation of an audio waveform can produce what is heard to the ear as a tone. The occurrence of such tones are not limited to audio frequencies but can span the spectrum of frequencies, including, for example, radio frequencies (RF) below or at microwave and millimeter frequencies, as may be used, for example, to implement radar systems.

To reduce the deterministic and cyclical nature of quantization error, a nondeterministic (random) adjustment can be applied to the quantization process and apparatus. This effectively random adjustment, which may, for example, be random or pseudorandom in nature, is called dither. By introducing dither as an intentionally applied form of noise used to randomize quantization error, cyclical effects of quantization error can be mitigated. Dither can be used to reduce distortion caused by element mismatch in ADCs, especially in pipeline ADCs and cyclic ADCs (a single-stage ADC where the output of a sum is sampled and held, and fed back to an input of the ADC). In accordance with at least one embodiment, dither can be added to the reference path (rather than to the signal path) in a continuous time sigma-delta ADC. The technique can be used for any multi-bit sigma-delta ADC for any application and provides a mechanism for improving spurious free dynamic range (SFDR). If desired, this technique can be used in addition to other known mechanisms for further improvement, as this technique does not exclude their application. At least one embodiment implements dither to reduce tones in the ADC spectrum by swapping comparator references. Swapping the comparator references has the effect of randomizing both comparator offsets and DAC element mismatches.

Dither can be added via comparator reference swapping to improve distortion performance in a very short development time frame without affecting die area, excess loop delay and stability, and with minimal extra power and noise generation. At least one embodiment is incorporated in a multi-bit sigma-delta ADC. At least one embodiment is incorporated in a pipelined ADC. At least one embodiment is incorporated in a cyclic ADC. At least one embodiment utilizes a programmable dither value (such as the dither amp value). The programmable dither value allows selection of a mode of operation of the decoder. The mode of operation of the decoder can specify attributes such as a number of bits of a linear feedback shift register (LFSR) upon which the decoding depends, the number of comparators to be reconfigured, or both.

Dither is added by swapping the reference lines for pairs of comparators. As comparator pairs are naturally laid out next to each other and use the same reference lines, this provides an elegant solution requiring little or no extra die area. The swap is done at the start of the "hold" time of the comparator, giving time for the references to settle before they are used. A programmable method of choosing how many comparator pairs are allowed to swap at a given time adds the ability to trade off signal to noise ratio (SNR) degradation for distortion and intermodulation performance. Because dither is added to the reference path, it avoids possible issues from adding dither to signal paths. Adding dither to the reference path also has the effect of randomizing quantizer trip points to some extent, which can reduce or eliminate tones due to non-ideal comparators in the quantizer.

Also included is programmability for the frequency at which the swapping is done, which allows further tradeoffs with randomization of the DAC elements vs. the DAC glitch energy produced when elements are swapped. Dither implemented this way can be used with or without other common dynamic element matching techniques which change the connections between comparators and DAC elements.

Accordingly, improved ADC accuracy can be provided, which provides a technological improvement to ADC performance. Such improved accuracy can be reflected in reduced harmonic distortion in an ADC, which can, for example, reduce IMD products. Such a reduction in IMD products can, as an example, reduce false targets in a radar system. It will be understood that the embodiments described below represent a particular type of ADC circuit to which the teachings of the present disclosure are applied. It will be further understood that other types of ADC circuits may be similarly improved by the incorporation of the reference path dithering as described in the present disclosure. In particular, a Flash converter or a sigma-delta ADC can reasonably expect to benefit from the application of the teaching of the present disclosure.

Figure 2:
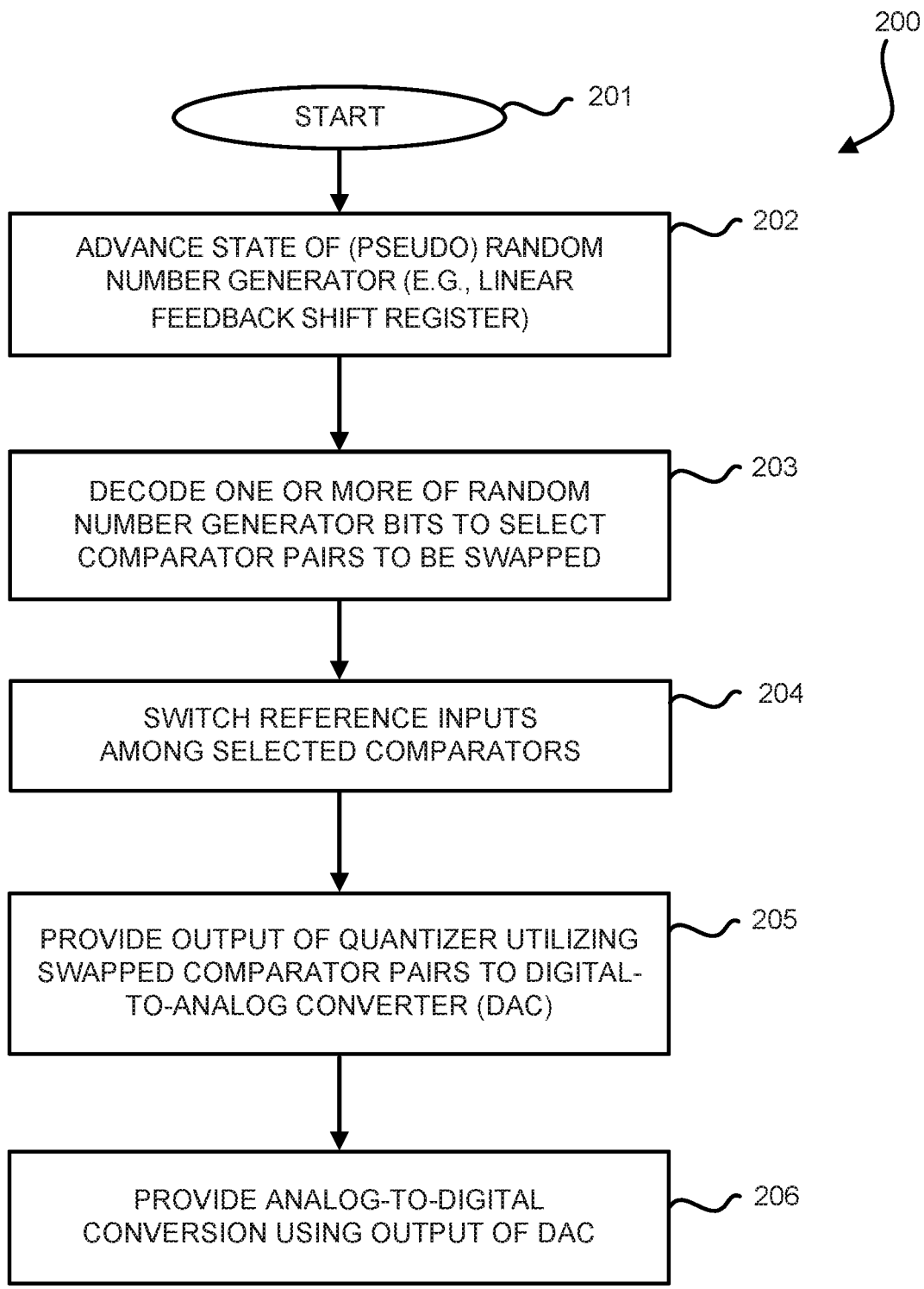
FIG. 2 is a flow diagram illustrating a method in accordance with at least one embodiment.
Figure 3:
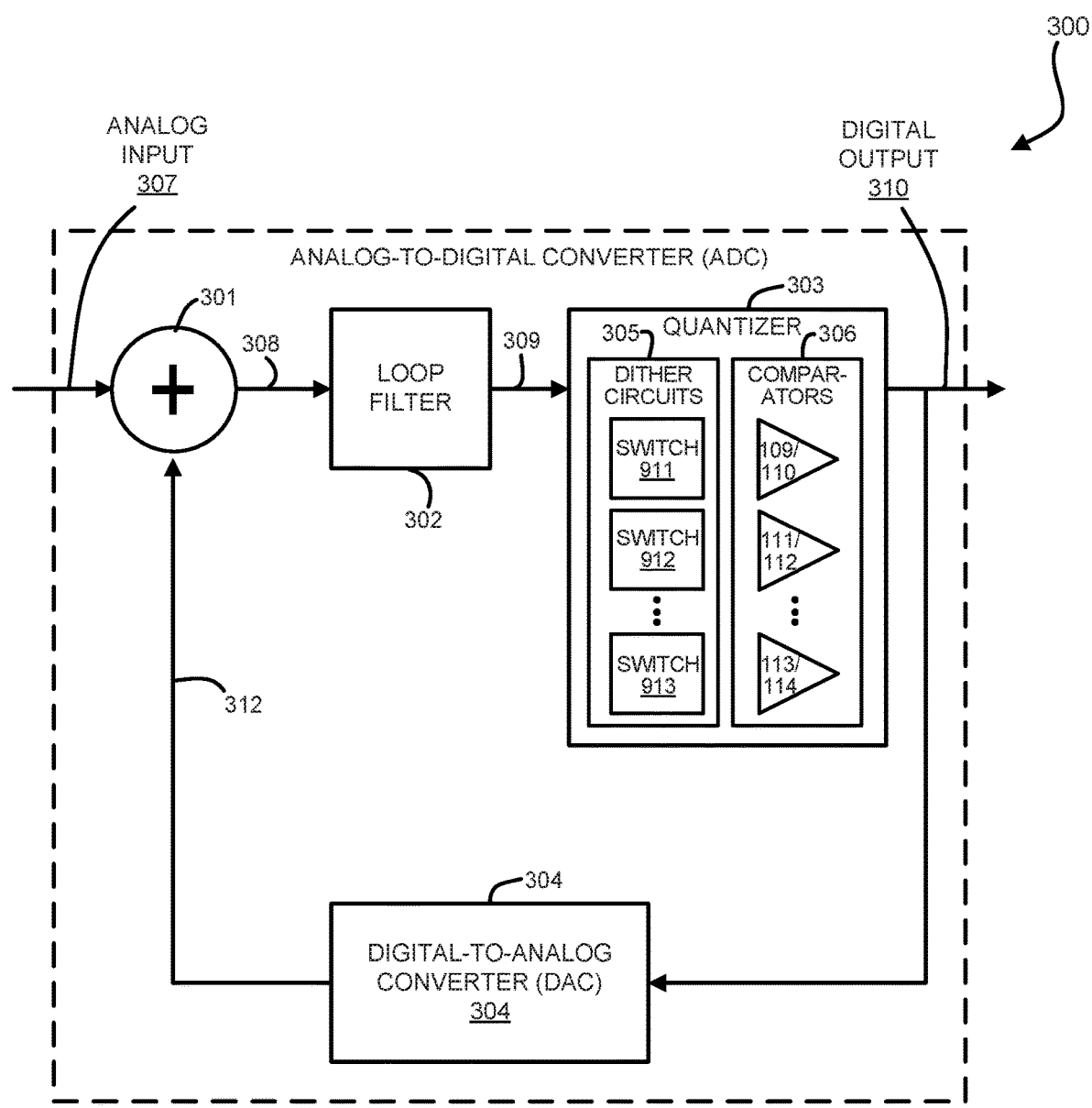
FIG. 3 is a block diagram illustrating an analog-to-digital converter in accordance with at least one embodiment.

FIG. 3 is a block diagram illustrating an analog-to-digital converter in accordance with at least one embodiment. While more detailed aspects will be discussed below with reference to FIGS. 1 and 2, FIG. 3 provides an overview in the context of one exemplary embodiment of ADC 300 within which circuit 100 of FIG. 1 and method 200 of FIG. 2 may be implemented. ADC 300 comprises a combiner 301, a loop filter 302, a quantizer 303, and a digital-to-analog converter (DAC) 304. Analog input 307 is connected to a first input of combiner 301. DAC output 312 is connected to a second input of combiner 301. Combiner 301 adjusts an analog input signal at analog input 307 by an adjustment signal at DAC output 312. For example, combiner 301 may be a summing circuit to adjust the input signal at analog input 307 by the adjustment signal at DAC output 312 such that the combiner output 308 of combiner 301 is the sum of an analog input value of the analog input signal and an adjustment value of the adjustment signal.

Combiner 301 is connected to loop filter 302 and provides combiner output 308 to an input of loop filter 302. Loop filter 302 provides a filtered signal at filtered output 309, which is connected to an input of quantizer 303. Quantizer 303 comprises, among other elements as illustrated in FIG. 1, dither circuits 305 and comparators 306. Dither circuits 305 comprise switches 911, 912, and 913, among others as denoted by the ellipsis. Comparators 306 comprise comparators 109 and 110, 111 and 112, and 113 and 114, among others as denoted by the ellipsis. Comparators 306 receive the filtered signal or a signal obtained from the filtered signal. Each of dither circuits 305 receives a respective pair of reference levels and either swaps or does not swap comparator reference level inputs for its respective pairs of comparators of comparators 306. A digital signal at digital output 310 is provided as a comparator output signal of one or more of comparators 306 or as a signal obtained from a comparator output signal of one or more of comparators 306. Digital output 310 is connected to and provided to an input of DAC 304. DAC 304 provides from its one or more digital inputs an adjustment signal at DAC output 312, which is connected to the second input of combiner 301. In a particular embodiment, one or more of input 307 and outputs 308, 309, and 312 are differential signals, as needed or desired.

FIG. 1 is a block diagram illustrating a circuit in accordance with at least one embodiment. Circuit 100 comprises a quantizer (to the left of interconnects 189, 190, 191, 192, 193, and 194), such as quantizer 303 of FIG. 3, and a digital-to-analog converter (DAC) (to the right of the same interconnects), such as DAC 304 of FIG. 3. The quantizer comprises linear feedback shift register (LFSR) 101, decoder 102, toggle-flops 103, 104, and 105, inverters 106, 107, and 108, switches 911, 912, and 913, comparators 109, 110, 111, 112, 113, and 114, latches 115, 116, 117, 118, 119, and 120. The DAC comprises latches 121, 122, 123, 124, 125, and 126, current sources 127, 128, 129, 130, 131, and 132, and switches 145, 146, 147, 148, 149, 150, 151, 152, 153, 154, 155, and 156. The quantizer also comprises a plurality of voltage references, which are shown as being implemented using a series resistor network comprising resistors 159, 160, 163, 164, 169, 170, and 173.

A voltage divider circuit formed between a first reference voltage source connected to interconnect 157 and a second voltage source connected to interconnect 158. A first reference voltage source, such as a more positive reference voltage source, labeled vrefp, is connected to interconnect 157, which is connected to a first terminal of resistor 159. As second terminal of resistor 159 is connected to interconnect 161, which is connected to a first terminal of resistor 163. A second terminal of resistor 163 is connected to interconnect 165, which is connected to a resistor in a portion of the voltage divider circuit not illustrated. Another resistor in the unillustrated portion of the voltage divider circuit is connected to interconnect 167, which is connected to a first terminal of resistor 169. A second terminal of resistor 169 is connected to interconnect 171, which is connected to a first terminal of resistor 173. A second terminal of resistor 173 is connected to interconnect 172, which is connected to a first terminal of resistor 170. A second terminal of resistor 170 is connected to interconnect 168, which is connected to a resistor in a portion of the voltage divider circuit not illustrated. Another resistor in the unillustrated portion of the voltage divider circuit is connected to interconnect 166, which is connected to a first terminal of resistor 164. A second terminal of resistor 164 is connected to interconnect 162, which is connected to a first terminal of resistor 160. A second terminal of resistor 160 is connected to interconnect 158, which is connected to a second reference voltage source, such as a more negative reference voltage source, labeled vrefm.

Interconnect 161 is connected to a first input of switch 911. Interconnect 162 is connected to a second input of switch 911. A first output of switch 911 is connected to noninverting reference input of comparator 109 and to an inverting reference input of comparator 110. A second output of switch 911 is connected to an inverting reference input of comparator 109 and to a noninverting reference input of comparator 110. Interconnect 165 is connected to a first input of switch 912. Interconnect 166 is connected to a second input of switch 912. A first output of switch 912 is connected to a noninverting input of comparator 111 and to an inverting input of comparator 112. A second output of switch 912 is connected to an inverting input of comparator 111 and to a noninverting input of comparator 112. Interconnect 171 is connected to a first input of switch 913. Interconnect 172 is connected to a second input of switch 913. A first output of switch 913 is connected to a noninverting input of comparator 113 and to an inverting input of comparator 114. A second output of switch 913 is connected to an inverting input of comparator 113 and to a noninverting input of comparator 114.

LFSR 101 provides a digital output at interconnect 904. In the illustrated example, interconnect 904 is labeled LFSR [7:0] to denote an eight-bit parallel digital output from LFSR7, as its most significant bit (MSB), to LFSR0, as its least significant bit (LSB). Interconnect 904 is connected to an input of decoder 102, providing the digital output of LFSR 101 to decoder 102. Decoder 102 is connected to interconnect 905 and receives from interconnect 905 a dither amp input, labeled, in the illustrated example, as DITHER_AMP[1:0] to denote a two-bit parallel digital input. The DITHER_AMP[1:0] input can be used to selectively balance harmonic reduction vs. noise, which can be seen as a change in the noise floor. Decoder 102 is connected to interconnect 906 and receives from interconnect 906 a Q input, labeled, in the illustrated example, as Q[15:0] to denote a 16-bit parallel digital input. Decoder 102 is connected to interconnect 907 and provides a digital output to interconnect 907, labeled, in the illustrated example, as S[7:0] to denote an eight-bit digital output. The bits of the digital output at interconnect 907 can be used to swap or to not swap reference inputs to comparators, such as comparators 109, 110, 111, 112, 113, and 114.

Decoder 102 uses DITHER_AMP bits and LFSR bits to determine the S bits it provides as its output. Optionally, decoder 102 can use Q bits from the outputs of one or more of comparators 109, 110, 111, 112, 113, and 114 to be included in determining the S bits decoder 102 provides as its output. As an example, the outputs of the comparators can be applied to inputs of exclusive OR (XOR) gates to produce the Q bits to be provided to decoder 102. The use of Q bits by decoder 102 can spread noise out of band, simplifying further processing, for example, by allowing easy filtering to remove the noise.

As an example, decoder 102 can use the DITHER_AMP bits to determine how many references are to be swapped and can use at least a portion of the LFSR bits to determine the locations at which those references are to be swapped. As a first example, DITHER_AMP bits having a binary value 00 can denote exactly one pair of references to be swapped, for example, causing exactly one of the switches (e.g., switches 911, 912, 913, and any other switches as may be included between switch 912 and 913, as denoted by the ellipsis in FIG. 1) to change to an opposite state, leaving all other switches in their previous state. As a second example, DITHER_AMP bits having a binary value 01 can denote exactly two pairs of references to be swapped, for example, causing exactly two of the switches (e.g., switches 911, 912, . . . , 913) to change to an opposite state, leaving all other switches in their previous state. As a third example, DITHER_AMP bits having a binary value 10 can denote exactly four pairs of references to be swapped, for example, causing exactly four of the switches (e.g., switches 911, 912, . . . , 913) to change to an opposite state, leaving all other switches in their previous state.

At least one embodiment can utilize a particular value of the DITHER_AMP bits (e.g., the binary value 11) to allow use of the LFSR output bits to directly determine the S bits output by decoder 102. Accordingly, the number of instances of dithering can be determined by the number of bits of a particular state (e.g., binary value 1) among the LFSR output bits and the locations of those instances of dithering can be determined by the locations of those bits of a particular state among the LFSR output bits when the particular direct-output value of the DITHER_AMP bits is present. A table showing such examples is set forth below.

| DITHER_AMP - 1:0 | LSFR - 2:0 | S[7:0] |
|---|---|---|
| 00 | 111 | 10000000 |
| 00 | 110 | 01000000 |
| 00 | 101 | 00100000 |
| . . . | . . . | . . . |
| 01 | 111 | 11000000 |
| 01 | 110 | 01100000 |
| 01 | 101 | 00110000 |
| . . . | . . . | . . . |
| 10 | 111 | 11110000 |
| 10 | 110 | 01111000 |
| 10 | 101 | 00111100 |
| . . . | . . . | . . . |
| 11 | xxx | S[7:0] = LSFR[7:0] |

Furthermore, in accordance with at least one embodiment, an option can be provided to turn off all instances of dithering, reverting the switches (e.g., switches 911, 912, . . . , 913) to their previous states (e.g., by outputting s[7:0] equal to the binary value 00000000). By turning off dithering entirely, the best signal-to-noise ratio (SNR) can be provided at the expense of increased harmonic content. If decreased harmonic content is preferred and some decrease in SNR can be tolerated, dithering can be implemented in any of the various ways described herein.

As examples, a LSB of S[7:0], labeled S[0], is provided to a D input of toggle-flop 103 via interconnect 908, a second-least significant bit of S[7:0], labeled S[1], is provided to a D input of toggle-flop 104 via interconnect 909, and a MSB of S[7:0], labeled S[7], is provided to a D input of toggle-flop 105 via interconnect 910. Toggle-flop 103 provides a digital switch control output at its Q output to interconnect 174, which is inverted by inverter 106 to provide an inverted digital switch control output at interconnect 175. Toggle-flop 104 provides a digital switch control output at its Q output to interconnect 176, which is inverted by inverter 107 to provide an inverted digital switch control output at interconnect 177. Toggle-flop 105 provides a digital switch control output at its Q output to interconnect 178, which is inverted by inverter 108 to provide an inverted digital switch control output at interconnect 179. Toggle-flops 103, 104, and 105 operate to provide an output that changes on a clock edge to an opposite state as before the clock edge when the input is high, but maintains the output in the original state after the clock edge when the input is low. In a particular embodiment, toggle-flops 103, 104, and 105 are implemented utilizing a latch (e.g., a D flip-flop) and a multiplexor. Here, the Q output of the latch is connected to a first input of the multiplexor, the inverted Q output (QB) of the latch is connected to a second input of the multiplexor, the output of the multiplexor is connected to the input of the latch, and the select input of the multiplexor is connected to the respective bit of S[7:0]. An analog signal to be converted is referred to as SIG and may comprise, for example, a differential signal having a non-inverted signal SIG+ and an inverted signal SIG−. Non-inverted signal, labeled SIG+, is provided at interconnect 180, which is connected to a non-inverting signal input of each of comparators 109, 110, 111, 112, 113, and 114. Inverted signal, labeled SIG−, is provided at interconnect 181, which is connected to an inverting signal input of each of comparators 109, 110, 111, 112, 113, and 114.

Switch 911 comprises switch 133, switch 134, switch 135, and switch 136. Interconnect 161 is connected to first terminal of switch 133 and to a first terminal of switch 135. Interconnect 162 is connected to a first terminal of switch 134 and to a first terminal of switch 136. A second terminal of switch 133 and a second terminal of switch 136 are connected to a non-inverting reference input of comparator 109 and to an inverting reference input of comparator 110. A second terminal of switch 134 and a second terminal of switch 135 are connected to an inverting reference input of comparator 109 and to a non-inverting reference input of comparator 110. Interconnect 174 is connected to a control terminal of switch 133 and to a control terminal of switch 134. Interconnect 175 is connected to a control terminal of switch 135 and to a control terminal of switch 136.

Switch 912 comprises switch 137, switch 138, switch 139, and switch 140. Interconnect 165 is connected to first terminal of switch 137 and to a first terminal of switch 139. Interconnect 166 is connected to a first terminal of switch 138 and to a first terminal of switch 140. A second terminal of switch 137 and a second terminal of switch 140 are connected to a non-inverting reference input of comparator 111 and to an inverting reference input of comparator 112. A second terminal of switch 138 and a second terminal of switch 139 are connected to an inverting reference input of comparator 111 and to a non-inverting reference input of comparator 112. Interconnect 176 is connected to a control terminal of switch 137 and to a control terminal of switch 138. Interconnect 177 is connected to a control terminal of switch 139 and to a control terminal of switch 140.

Switch 913 comprises switch 141, switch 142, switch 143, and switch 144. Interconnect 171 is connected to first terminal of switch 141 and to a first terminal of switch 143. Interconnect 172 is connected to a first terminal of switch 142 and to a first terminal of switch 144. A second terminal of switch 141 and a second terminal of switch 144 are connected to a non-inverting reference input of comparator 113 and to an inverting reference input of comparator 114. A second terminal of switch 142 and a second terminal of switch 143 are connected to an inverting reference input of comparator 113 and to a non-inverting reference input of comparator 114. Interconnect 178 is connected to a control terminal of switch 141 and to a control terminal of switch 142. Interconnect 179 is connected to a control terminal of switch 143 and to a control terminal of switch 144.

Comparator 109 compares the analog input signal to be converted to digital form, for example, the signal SIG comprising non-inverted signal SIG+ at interconnect 180 and inverted signal SIG− at interconnect 181, to a reference signal, such as a differential reference signal comprising a non-inverted reference signal and an inverted reference signal, as provided by switch 911, and provides a comparator output at interconnect 182. Comparator 110 compares the analog input signal to be converted to digital form, for example, the signal SIG comprising non-inverted signal SIG+ at interconnect 180 and inverted signal SIG− at interconnect 181, to a reference signal, such as a differential reference signal comprising a non-inverted reference signal and an inverted reference signal, as provided by switch 911, and provides a comparator output at interconnect 183. Comparator 111 compares the analog input signal to be converted to digital form, for example, the signal SIG comprising non-inverted signal SIG+ at interconnect 180 and inverted signal SIG− at interconnect 181, to a reference signal, such as a differential reference signal comprising a non-inverted reference signal and an inverted reference signal, as provided by switch 912, and provides a comparator output at interconnect 184. Comparator 112 compares the analog input signal to be converted to digital form, for example, the signal SIG comprising non-inverted signal SIG+ at interconnect 180 and inverted signal SIG− at interconnect 181, to a reference signal, such as a differential reference signal comprising a non-inverted reference signal and an inverted reference signal, as provided by switch 912, and provides a comparator output at interconnect 185. Comparator 113 compares the analog input signal to be converted to digital form, for example, the signal SIG comprising non-inverted signal SIG+ at interconnect 180 and inverted signal SIG− at interconnect 181, to a reference signal, such as a differential reference signal comprising a non-inverted reference signal and an inverted reference signal, as provided by switch 913, and provides a comparator output at interconnect 187. Comparator 114 compares the analog input signal to be converted to digital form, for example, the signal SIG comprising non-inverted signal SIG+ at interconnect 180 and inverted signal SIG− at interconnect 181, to a reference signal, such as a differential reference signal comprising a non-inverted reference signal and an inverted reference signal, as provided by switch 913, and provides a comparator output at interconnect 188.

A comparator output of comparator 109 is connected via interconnect 182 to an input of latch 115. A comparator output of comparator 110 is connected via interconnect 183 to an input of latch 116. A comparator output of comparator 111 is connected via interconnect 184 to an input of latch 117. A comparator output of comparator 112 is connected via interconnect 185 to an input of latch 118. A comparator output of comparator 113 is connected via interconnect 187 to an input of latch 119. A comparator output of comparator 114 is connected via interconnect 188 to an input of latch 120.

An output, labeled Q[0], of latch 115 is connected via interconnect 189 to a D input of latch 121. An output, labeled Q[1], of latch 116 is connected via interconnect 190 to a D input of latch 122. An output, labeled Q[2], of latch 117 is connected via interconnect 191 to a D input of latch 123. An output, labeled Q[3], of latch 118 is connected via interconnect 192 to a D input of latch 124. An output, labeled Q[14], of latch 119 is connected via interconnect 193 to a D input of latch 125. An output, labeled Q[15], of latch 120 is connected via interconnect 194 to a D input of latch 126.

The Q output of latch 121 is connected as a control input to switch 145 and the QB output is connected as a control input to switch 146. A Q output of latch 122 is connected as a control input to switch 147 and the QB output is connected as a control input to switch 148. A Q output of latch 123 is connected as a control input to switch 149 and the QB output is connected as a control input to switch 150. A Q output of latch 124 is connected as a control input to switch 151 and the QB output is connected as a control input to switch 152. A Q output of latch 125 is connected as a control input to switch 153 and the QB output is connected as a control input to switch 154. A Q output of latch 126 is connected as a control input to switch 155 and the QB output is connected as a control input to switch 156.

A first current output line 902, labeled ioutp, is connected to a first terminal of each of switches 145, 147, 149, 151, 153, and 155. A second current output line 903, labeled ioutm, is connected to a first terminal of each of switches 146, 148, 150, 152, 154, and 156. A second terminal of each of switches 145 and 146 is connected to a first terminal of current source 127. A second terminal of current source 127 is connected to a fixed reference voltage, such as ground. A second terminal of each of switches 147 and 148 is connected to first terminal of current source 128. A second terminal of current source 128 is connected to a fixed reference voltage, such as ground. A second terminal of each of switches 149 and 150 is connected to a first terminal of current source 129. A second terminal of current source 129 is connected to a fixed reference voltage, such as ground. A second terminal of each of switches 151 and 152 is connected to a first terminal of current source 130. A second terminal of current source 130 is connected to a fixed reference voltage, such as ground. A second terminal of each of switches 153 and 154 is connected to a first terminal of current source 131. A second terminal of current source 131 is connected to a fixed reference voltage, such as ground. A second terminal of each of switches 155 and 156 is connected to a first terminal of current source 132. A second terminal of current source 132 is connected to a fixed reference voltage, such as ground.

In operation, comparators 109, 110, 111, 112, 113, and 114 compare a signal comprising non-inverted signal SIG+ and inverted signal SIG- to the reference signals from 911, 912, and 913 to produce comparison results, which are clocked through latches 115, 116, 117, 118, 119, 120, 121, 122, 123, 124, 125, and 126 to control the selective connections of current sources 127, 128, 129, 130, 131, and 132 to complementary current output lines 902 and 903. The current output signal provided comprises current output signal ioutp and current output signal ioutm. In a particular embodiment, latches 115, 116, 117, 118, 119, and 120 only add one cycle of delay from the comparator outputs to the DAC switches. In a particular embodiment, flip-flops can be utilized in place of latches 115, 116, 117, 118, 119, and 120. Here, it will be noted that, depending on the actual implementation of clock circuit, the use of flip-flops can add an extra clock cycle to the operation, which would be undesirable. Thus the skilled artisan will understand that the implementation of the clocking circuit would need to be carefully designed to avoid the addition of clock cycles between the comparator outputs and the DAC switches.

Since the comparison results are dependent upon the reference signals provided to comparators 109, 110, 111, 112, 113, and 114, imperfections in the elements that provide those reference signals and/or comparator offsets can affect the comparison results, which can affect the accuracy of the ADC. By providing switches, such as switches 911, 912, and 913 to switch the reference signals being provided to comparators 109, 110, 111, 112, 113, and 114, circuit 100 can dynamically swap the reference signals, allowing any unwanted variation among the reference signals to be cancelled out over time. This further improves offset in comparators 109, 110, 111, 112, 113, and 114, and improves mismatch in current sources 127, 128, 129, 130, 131, and 132.

The embodiments described above utilize reference path dithering where the reference signals are voltage signals. However, it will be further understood that the teachings of the present disclosure are not necessarily limited to dithering on voltage signals only, but may be similarly applied where an ADC circuit utilizes currents as references.

FIG. 2 is a flow diagram illustrating a method in accordance with at least one embodiment. Method 200 begins at block 201 and continues to block 202. At block 202, a state of a random number generator is advanced to a next state. The random number generator may, for example, be a pseudorandom number generator. As an example, the random number generator may utilize a linear feedback shift register (LFSR). From block 202, method 200 continues to block 203. At block 203, one or more random number generator bits are decoded to select comparator reference pairs to be swapped. From block 203, method 200 continues to block 204. At block 204, reference inputs are switched among selected comparators. From block 204, method 200 continues to block 205. At block 205, the output of a quantizer utilizing swapped comparator pairs is provided to a digital-to-analog converter (DAC). From block 205, method 200 continues to block 206. At block 206, an analog-to-digital conversion is provided using an output of the DAC.

In accordance with at least one embodiment, comparator outputs in the quantizer are connected directly to individual current sources in the DAC (neglecting the latches that time the signals). The references to the comparators are swapped randomly in pairs 15/0, 14/1, 13/2, 12/3, 11/4, 10/5, 9/6, 8/7. This has the effect of randomizing quantizer/DAC dynamic nonlinearity (DNL).

How often the comparators are swapped is controlled by decoder whose inputs come from an LFSR. The frequency at which the LFSR provides output data can be programmable. As an example, the LFSR may be programmed to provide output data at the LFSR output every 1, 2, 4, 8, etc. samples being obtained by the ADC. A first logic level, such as a logic level representing a zero (0), from the decoder does not swap the comparators, while a second logic level, such as a logic level representing a one (1), from the decoder swaps the comparators. The decoder has four different settings for swapping as follow:

00—one pair per cycle
    01—two pairs per cycle
    10—four pairs per cycle
    11—which pairs and how many (0-8 pairs) are controlled by the LFSR bits.

In accordance with at least one embodiment, the bits LFSR[7:0] are deliberately chosen to NOT be bits next to each other in the shift register. The clock for the LFSR is programmable to allow a tradeoff with randomness vs. DAC glitch energy. The toggle flip flop doubles the length of the random code from the LFSR, which reduces the frequency of spurs caused by the repetition rate of the pseudo random number generation.

At least one embodiment doesn't modify the reference values on the reference lines. Rather, the connections of the reference lines are changed to reconfigure how the reference lines carrying the unchanged reference values are connected to the comparators. In accordance with various embodiments or a single embodiment providing mode selectivity, various numbers of pairs of reference lines can be switched, such as a single pair, two pairs, four pairs, up to all pairs, which increases the randomness. Fewer than all of the reference connections can be switched at any given time.

At least one embodiment can avoid adding dither in a signal path. An input signal can be provided to a signal input terminal of a comparator without having to pass through a dithering circuit. Mismatch compensation can be provided using the comparator references with no change to the signal path.

At least one embodiment avoids the need for additional instances of existing components, such as multiple input transistors in the comparator, to create dither. By avoiding the need for extra input transistors, an unnecessary increase in the area occupied by the circuit on a semiconductor die can be avoided.

At least one embodiment can avoid switching between two quantizer circuits to create dither. By avoiding increasing the number of comparators in a quantizer circuit, an unnecessary increase in the area occupied by the circuit on a semiconductor die can be avoided.

In accordance with at least one embodiment, an analog-to-digital converter (ADC) includes a quantizer to receive an analog signal input and to provide a quantizer output. The quantizer comprises a linear-feedback shift register (LFSR) providing a LFSR output; a decoder connected to the LFSR, the decoder having a plurality of decoder outputs, each decoder output to provide a switch control signal responsive to a LFSR value of the LFSR output; an electrical reference having a plurality of reference outputs, each reference output to provide a reference level signal; a first switch, having a first switch output and a second switch output, the first switch output connected to a first one of the reference outputs when a first one of the switch control signals is in a first state and connected to a second one of reference outputs when the first switch control signal is in a second state, and the second switch output connected to the second reference output when the first control signal is in the first state and connected to the first reference output when the first control signal is in the second state; and a comparator, the comparator having a signal input, a first reference input, and a second reference input, the first reference input connected to the first switch output, and the second reference input connected to the second switch output.

In accordance with at least one embodiment, the decoder comprises a mode selection input, the mode selection input configured to receive a mode selection value, wherein the mode selection value determines a first switch operation of a second switch to switch a third reference output and a fourth reference output of the plurality of reference outputs in response to a second switch control signal of the plurality of switch control signals. In accordance with at least one embodiment, with the mode selection value indicating a first mode of operation, the first switch operation is not made to be identical to a second switch operation of the first switch, and, with the mode selection value indicating a second mode of operation, the first switch operation is made to be identical to the second switch operation. In accordance with at least one embodiment, with the mode selection value indicating a third mode of operation, the first switch operation depends on a first LFSR bit value of the LFSR value and the second switch operation depends on a second LFSR bit value of the LFSR value. In accordance with at least one embodiment, the decoder is connected to the quantizer digital output, wherein the first switch control signal is dependent upon a quantizer digital output value of at least one bit of the quantizer digital output. In accordance with at least one embodiment, a state of the LFSR is advanced at a programmable LFSR clock frequency. In accordance with at least one embodiment, the ADC is selected from a group consisting of a sigma-delta ADC and a pipelined ADC.

In accordance with at least one embodiment, a method comprises advancing a state of a random number generator; decoding one or more random number generator bits provided by the random number generator to select one or more comparator pairs to be swapped; switching reference inputs among comparators for each of the one or more comparator pairs selected to be swapped; providing a quantizer digital output of a quantizer utilizing the one or more comparator pairs selected to be swapped to a digital-to-analog converter (DAC); providing analog-to-digital conversion using an analog output of the DAC. In accordance with at least one embodiment, the decoding is performed based partially on a mode selection value received from a mode selection input, wherein a first switch operation for swapping a first comparator pair of the comparator pairs is determined by the one or more random number generator bits and wherein the mode selection value determines a second switch operation for swapping a second comparator pair of the comparator pairs. In accordance with at least one embodiment, with the mode selection value indicating a first mode of operation, the second switch operation is not made to be identical to the first switch operation, and, with the mode selection value indicating a second mode of operation, the second switch operation is made to be identical to the first switch operation. In accordance with at least one embodiment, with the mode selection value indicating a third mode of operation, the first switch operation depends on a first random number generator bit of the one or more random number generator bits and the second switch operation depends on a second random number generator bit of the one or more random number generator bits. In accordance with at least one embodiment, the decoding is dependent upon a quantizer digital output value of at least one bit of the quantizer digital output. In accordance with at least one embodiment, the advancing a state of a random number generator is performed at a programmable LFSR clock frequency.

In accordance with at least one embodiment, an analog-to-digital converter (ADC) comprises a digital-to-analog converter (DAC), the DAC having a digital input and an analog output; and a quantizer, the quantizer having a quantizer digital output connected to the digital input. The quantizer comprises a random number generator circuit providing a random output; a decoder connected to the random number generator circuit and configured to provide a plurality of switch control signals at a plurality of decoder outputs, the switch control signals responsive to a random output value of the random output; an electrical reference having a plurality of reference outputs, each reference output to provide a reference level signal; a first switch, having a first switch output and a second switch output, the first switch output connected to a first one of the reference outputs when a first one of the switch control signals is in a first state and connected to a second one of reference outputs when the first switch control signal is in a second state, and the second switch output connected to the second reference output when the first control signal is in the first state and connected to the first reference output when the first control signal is in the second state; and a comparator, the comparator having a signal input, a first reference input, and a second reference input, the first reference input connected to the first switch output, and the second reference input connected to the second switch output.

In accordance with at least one embodiment, the decoder comprises a mode selection input, the mode selection input configured to receive a mode selection value, wherein the mode selection value determines a first switch operation of a second switch to switch a third reference output and a fourth reference output of the plurality of reference outputs in response to a second switch control signal of the plurality of switch control signals. In accordance with at least one embodiment, with the mode selection value indicating a first mode of operation, the first switch operation is not made to be identical to a second switch operation of the first switch, and, with the mode selection value indicating a second mode of operation, the first switch operation is made to be identical to the second switch operation. In accordance with at least one embodiment, with the mode selection value indicating a third mode of operation, the first switch operation depends on a first LFSR bit value of the LFSR value and the second switch operation depends on a second LFSR bit value of the LFSR value. In accordance with at least one embodiment, the decoder is connected to the quantizer digital output, wherein the first switch control signal is dependent upon a quantizer digital output value of at least one bit of the quantizer digital output. In accordance with at least one embodiment, a state of the random number generator circuit is advanced at a programmable random number generator clock frequency. In accordance with at least one embodiment, the ADC is selected from a group consisting of a sigma-delta ADC and a pipelined ADC.

The concepts of the present disclosure have been described above with reference to specific embodiments. However, one of ordinary skill in the art will appreciate that various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

What is claimed is:

1. An analog-to-digital converter (ADC) including a quantizer to receive an analog signal input and to provide a quantizer output, the quantizer comprising:
   a linear-feedback shift register (LFSR) providing a LFSR output;
   a decoder connected to the LFSR, the decoder having a plurality of decoder outputs, each decoder output to provide a switch control signal responsive to a LFSR value of the LFSR output;
   an electrical reference having a plurality of reference outputs, each reference output to provide a reference level signal;
   a plurality of switches, each switch having an input, a first switch output and a second switch output, the switch input connected to a first one of the decoder outputs to receive a first one of the switch control signals, the first switch output connected to a first one of the reference outputs when the first switch control signal is in a first state and connected to a second one of reference outputs when the first switch control signal is in a second state, and the second switch output connected to the second reference output when the first control signal is in the first state and connected to the first reference output when the first control signal is in the second state, wherein the input of each one of the plurality of switches is connected to a different one of the plurality of decoder outputs; and
   a plurality of comparators, each comparator having a signal input, a first reference input, and a second reference input, the first reference input connected to the first switch output of an associated one of the plurality of switches, and the second reference input connected to the second switch output of the associated switch.

2. The ADC of claim 1 wherein the decoder comprises:
   a mode selection input, the mode selection input configured to receive a mode selection value, wherein each decoder output further provides the switch control signal responsive to the mode selection value.

3. The ADC of claim 2 wherein the decoder selects a number of switch control signals to assert based upon the mode selection value.

4. The ADC of claim 2 wherein each switch control signal is asserted based upon an associated bit of the LSFR value when the mode selection value indicates a particular value.

5. The ADC of claim 1 wherein the decoder is connected to the quantizer digital output, wherein the first switch control signal is dependent upon a quantizer digital output value of at least one bit of the quantizer digital output.

6. The ADC of claim 1 wherein a state of the LFSR is advanced at a programmable LFSR clock frequency.

7. The ADC of claim 1 wherein the ADC is selected from a group consisting of a sigma-delta ADC and a pipelined ADC.

8. An analog-to-digital converter (ADC) comprising:
   a digital-to-analog converter (DAC), the DAC having a digital input and an analog output; and
   a quantizer, the quantizer having a quantizer digital output connected to the digital input, the quantizer comprising:
      a random number generator circuit providing a random output;
      a decoder connected to the random number generator circuit and configured to provide a plurality of switch control signals at a plurality of decoder outputs, the switch control signals responsive to a random output value of the random output;
      an electrical reference having a plurality of reference outputs, each reference output to provide a reference level signal;
      a plurality of switches, each switch having an input, a first switch output and a second switch output, the switch input connected to a first one of the decoder outputs to receive a first switch control signals, the first switch output connected to a first one of the reference outputs when the first switch control signal is in a first state and connected to a second one of reference outputs when the first switch control signal is in a second state, and the second switch output connected to the second reference output when the first control signal is in the first state and connected to the first reference output when the first control signal is in the second state, wherein the input of each one of the plurality of switches is connected to a different one of the plurality of decoder outputs; and
      a plurality of comparators, each comparator having a signal input, a first reference input, and a second reference input, the first reference input connected to the first switch output of an associated one of the plurality of switches, and the second reference input connected to the second switch output of the associated switch.

9. The ADC of claim 8 wherein the decoder comprises:
   a mode selection input, the mode selection input configured to receive a mode selection value, wherein each decoder output further provides the switch control signal responsive to the mode selection value.

10. The ADC of claim 9 wherein the decoder selects a number of switch control signals to assert based upon the mode selection value.

11. The ADC of claim 9 wherein each switch control signal is asserted based upon an associated bit of the LSFR value when the mode selection value.

12. The ADC of claim 8 wherein the decoder is connected to the quantizer digital output, wherein the first switch control signal is dependent upon a quantizer digital output value of at least one bit of the quantizer digital output.

13. The ADC of claim 8 wherein a state of the random number generator circuit is advanced at a programmable random number generator clock frequency.

14. The ADC of claim 8 wherein the ADC is selected from a group consisting of a sigma-delta ADC and a pipelined ADC.

15. A method of providing an analog-to-digital converter (ADC), the method comprising:
 providing, at a linear-feedback shift register (LFSR), an LFSR output;
 providing, at a decoder connected to the LFSR output, a plurality of decoder outputs, each decoder output to provide a separate switch control signal responsive to a LFSR value of the LFSR output;
 providing a plurality of switches, each switch having a switch input, a first switch output, and a second switch output;
 coupling each switch output to an associated one of the decoder outputs to receive one of the separate switch control signals, wherein each decoder output is provided to a different one of the switches;
 providing an electrical reference having a plurality of reference outputs, each reference output to provide a reference level signal;
 coupling each first switch output to an associated first one of the reference outputs and each second switch output to an associated second one of the reference outputs when the first switch control signal is in a first state;
 coupling each first switch output to the associated second reference output and each second switch output to the associated first reference output when the first switch control signal is in a second state;
 providing a plurality of comparators, each comparator having a signal input, a first reference input, and a second reference input, wherein each comparator is associate with a different one of the switches;
 coupling each first reference input to the first switch output of the associated switch, and each second reference input to the second switch output of the associated switch.

16. The method of claim 15 further comprising:
 receiving, by the decoder, a mode selection input, the mode selection input configured to receive a mode selection value, wherein each decoder output further provides the switch control signal responsive to the mode selection value.

17. The method of claim 16 further comprising:
 selecting, by the decoder, a number of switch control signals to assert based upon the mode selection value.

18. The method of claim 16 further comprising:
 asserting each switch control signal based upon an associated bit of the LSFR value when the mode selection value indicates a particular value.

19. The method of claim 15 further comprising:
 connecting the decoder to the quantizer digital output wherein each switch control signal is dependent upon a quantizer digital output value of at least one bit of the quantizer digital output.

20. The method of claim 15 wherein a state of the LFSR is advanced at a programmable LFSR clock frequency.

* * * * *